United States Patent
Iyer

(10) Patent No.: US 6,337,286 B1
(45) Date of Patent: *Jan. 8, 2002

(54) METHOD FOR ETCHING METALS USING ORGANOHALIDE COMPOUNDS

(75) Inventor: Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/258,741

(22) Filed: Feb. 26, 1999

Related U.S. Application Data

(62) Division of application No. 08/918,593, filed on Aug. 19, 1997, now Pat. No. 6,033,992.

(51) Int. Cl.$^7$ .............................................. H01L 21/00
(52) U.S. Cl. ........................ 438/720; 156/345; 257/499; 438/710; 438/742
(58) Field of Search .................... 156/345 P; 438/710, 438/720, 742; 216/67, 75, 77; 257/499, 503

(56) References Cited

U.S. PATENT DOCUMENTS

| | | | |
|---|---|---|---|
| 4,557,796 A | 12/1985 | Druschke et al. ............. 216/78 |
| 5,079,178 A | 1/1992 | Chouan et al. ......... 438/720 X |
| 5,173,327 A | 12/1992 | Sandhu et al. ............... 427/573 |
| 5,382,550 A | 1/1995 | Iyer ........................... 437/235 |
| 5,405,491 A | 4/1995 | Shahvandi et al. .......... 156/643 |
| 5,849,207 A | 12/1998 | Sato .......................... 216/67 X |
| 6,033,992 A | * 3/2000 | Iyer ............................ 438/720 |

* cited by examiner

*Primary Examiner*—William Powell
(74) *Attorney, Agent, or Firm*—Schwegman, Lundberg, Woessner & Kluth, P.A.

(57) ABSTRACT

A process for plasma etching metal films comprising the steps of forming a noble gas plasma, then transporting the noble gas plasma to a mixing chamber. An organohalide is added to the noble gas plasma in the mixing chamber. The organohalide is selected to have a vapor pressure allowing the formation of activated complexes to etch the metal films and form organometallic compounds as the etch byproducts. The activated complexes thus formed are transported downstream to an etching chamber. In the etching chamber the selected substrate is exposed to the activated complexes, causing the substrate to be etched and organometallic compounds to be formed as byproducts from the reaction of the activated complexes and etching of the substrate. The organometallic byproducts can then be removed from the etch chamber.

33 Claims, 4 Drawing Sheets

$C_2H_5Br_2 + Ar^* \rightarrow CH_2CHBr^* + H^* + Br^*$ $\rightarrow CH_x^* + H^* + Br^*$

Fig. 3

$CH_2CHBr^* + Al \rightarrow (CH_2CH)_xAlBr$ $CH_x + Al \rightarrow (CH_x)_yAl$

Fig. 4

METHOD FOR ETCHING METALS USING ORGANOHALIDE COMPOUNDS

This application is a divisional of U.S. Ser. No. 08/918,593, filed Aug. 19, 1997, U.S. Pat. No. 6,033,992.

BACKGROUND OF THE INVENTION

1. Technical Field.

This invention relates to integrated circuit manufacturing processes and, more specifically, to a novel process using organohalide compounds for the etching of metal films to produce organometallic etch byproducts.

2. Background.

In order to build an integrated circuit, many active devices need to be fabricated on a single substrate. The current practice in semiconductor manufacturing is to use thin film fabrication techniques. Etching, in semiconductor applications, is a fabrication process used to produce patterns by which material is removed from the silicon substrate or from thin films on the substrate surface. A mask is typically used to protect desired surface regions from the etchant and this mask is stripped after the etching has been performed. The composition and uniformity of these thin layers must be strictly controlled to facilitate etching of submicron features.

As the pattern dimensions approach the thickness of the films being patterned, it is increasingly required that a dry etching process be selected. A number of dry etching process types exist. The process that has many applications in the fabrication of integrated circuits and that is widely used is plasma dry etching.

The basic concept of plasma dry etching is rather direct. A plasma is defined to be a partially ionized gas composed of ions, electrons, and a variety of neutral species. A glow discharge is a plasma that exists over a pressure range of 1 mtorr to 10 torr, containing approximately equal concentrations of positive particles (positive ions) and negative particles (electrons and negative ions). In plasma etching applications the glow discharge can be used to produce energetic ionic bombardment of the etched surface. However, the glow discharge has another even more important role, that of producing reactive species, such as atoms, radicals and ions from a relatively inert molecular gas, for chemically etching the surfaces of interest. A radical is an atom, or collection of atoms, which is electrically neutral, but which also exists in a state of incomplete chemical bonding, making it very reactive. The radicals, in fact, are responsible for most of the actual chemical etching phenomena that occur at the surface of the material being etched.

The characteristics of different etch processes vary widely with the process parameters, especially the gas composition. The gases adopted for plasma etching processes have traditionally been selected on the basis of their ability to form reactive species in plasma, which then react with the surface materials being etched and lead to volatile products. Traditionally molecules like carbon tetrachloride ($CCl_4$) and carbon tetrafluoride ($CF_4$) have been used because in a plasma reaction they produce the desirable reactive species which, in various combinations with other gases, etch silicon, silicon oxides, and other materials used in the manufacture of integrated circuits. Whereas heavily hydrogenated, organic analogs of these molecules, like methyl chloride ($CH_3Cl$) or methyl fluoride ($CH_3F$), have been considered to be undesirable starting materials because they tend to form polymers which interfere with the desired etch reaction.

The fluorine-containing gases used to etch Si and $SiO_2$, however, are not suitable for etching aluminum since the etch byproduct, $AlF_3$, has an unacceptably low vapor pressure. The etching of aluminum and aluminum alloy films is a very important step in the fabrication of integrated circuits. Other inorganic halide etch byproducts of aluminum (Al), such as $AlCl_3$, have sufficiently high vapor pressures to allow plasma etching of Al, and thus chlorine-containing gases have been exploited to develop dry-etch processes for aluminum films. There are drawbacks to using chlorine containing gases to etch aluminum, however, as they are all either carcinogenic or highly toxic and possess other disadvantages in the fabrication process, such as destroying the efficiency and life span of the pumps and other hardware used for plasma etching.

The deposition of the $AlCl_3$ etch byproduct on the plasma chamber walls also has deleterious effects on the etch process, so minimizing its deposition is important. Techniques used to manage $AlCl_3$ in plasma etching applications have traditionally included maintaining the temperature in the etch chamber above 35° C. (as the $AlCl_3$ evaporation rate at such temperatures is high enough to assist in removing it from the chamber), and using large gas flow rates to keep its partial pressure low. In general, the inorganic etch byproducts produced by the dry etching of aluminum and other metals are very stable with high heats of formation and relatively low vapor pressures, leading to low etch rates and lower production throughputs.

The economics of integrated circuit fabrication demand the highest throughput obtainable within a given set of production standards. On the whole, the demands of high throughput require the highest etch rate consistent with good results. What is still needed is a dry plasma etch process that allows for an improved, higher etch rate of metals for the semiconductor fabrication etch process.

SUMMARY OF THE INVENTION

The present invention provides a dry plasma etch process for metal that allows for an improved, faster etch rate of the metals for semiconductor fabrication processes.

In one preferred implementation, the present invention is a process for plasma etching metal films comprising the steps of forming a noble gas plasma, then transporting the noble gas plasma to a mixing chamber. An organohalide is added to the noble gas plasma in the mixing chamber. The organohalide is selected to have a vapor pressure allowing the formation of activated complexes to etch the metal films and form organometallic compounds as the etch byproducts. The activated complexes thus formed are transported downstream to an etching chamber. In the etching chamber the selected metal substrate is exposed to the activated complexes, causing the substrate to be etched and organometallic compounds to be formed as byproducts from the reaction of the activated complexes and etching of the metal substrate. The organometallic byproducts can then be removed from the etch chamber.

Additional advantages and novel features of the invention will be set forth in part in the description that follows, and in part will become apparent to those skilled in the art upon examination of the following or may be learned by practice of the invention.

DESCRIPTION OF THE FIGURES

FIG. 3 is representative chemical reactions for the formation of the precursors for the described embodiment of the process of this invention.

FIG. 4 is representative chemical reactions for the etching reaction and organometallic byproduct formation for the described embodiment of the process of this invention.

DETAILED DESCRIPTION

The semiconductor wafer etching method of the present invention is characterized by a downstream etch process comprising the steps of forming a noble gas plasma and then combining the formed plasma downstream with an organic halide for the formation of reactive precursors that can react with the metal to be etched in a manner that forms organometallic compounds as the etch byproducts. The organometallic byproducts can then be easily removed from the etch chamber.

Figure 1:
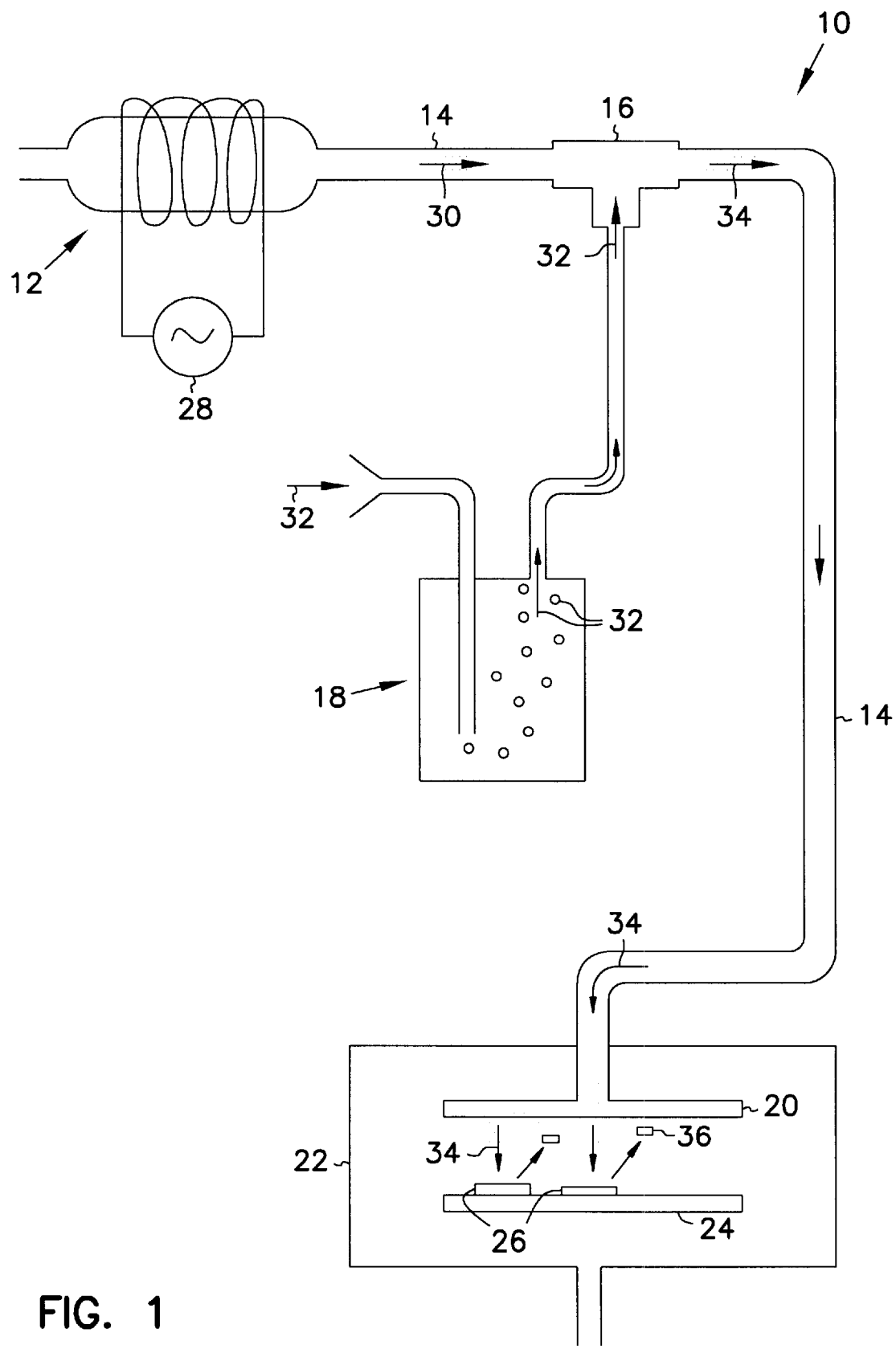
FIG. 1 is a schematic drawing of an exemplary plasma etch apparatus suitable for use with the process of this invention.
Figure 2:
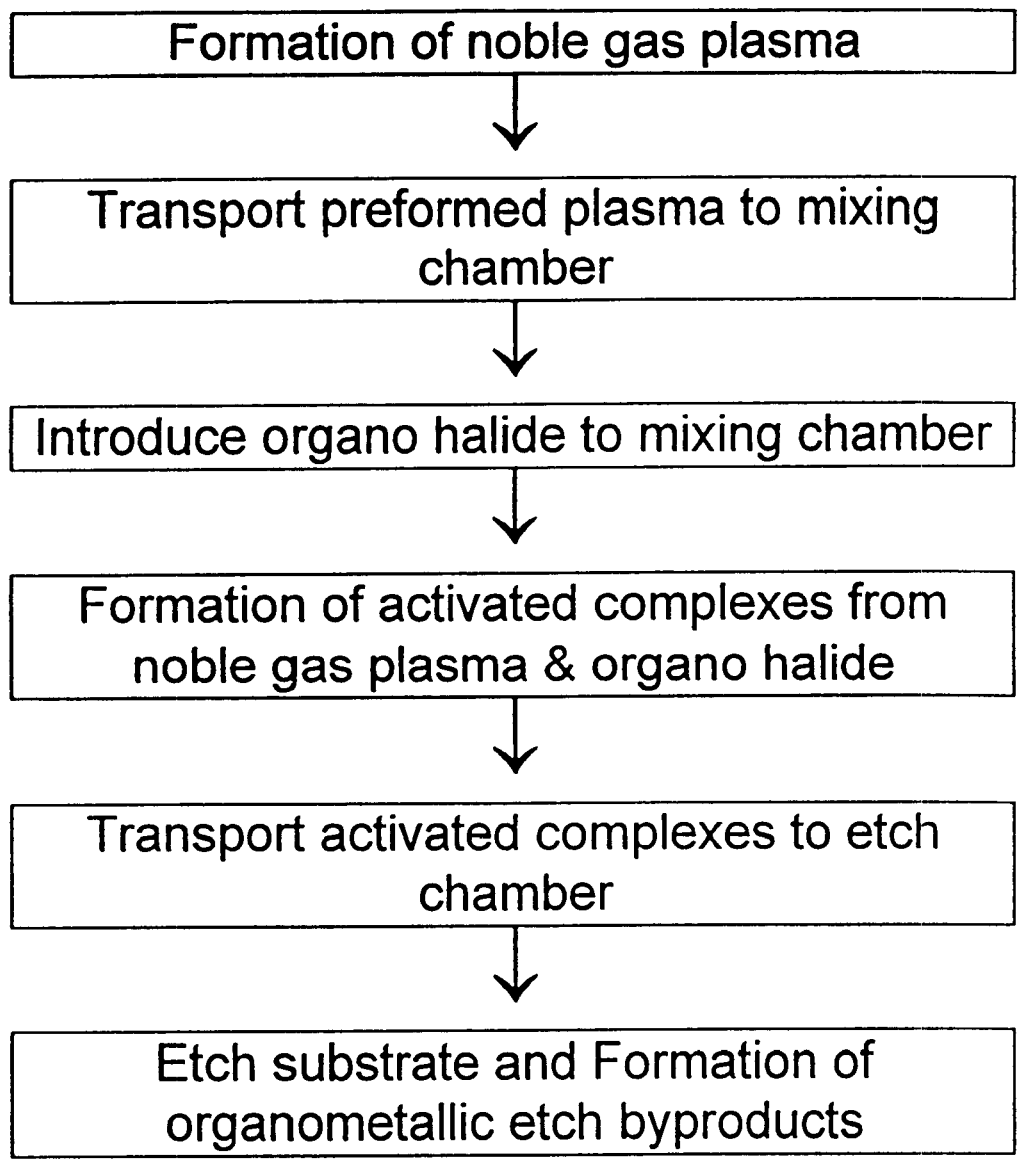
FIG. 2 is a flow chart of the steps for the given embodiment of the process of this invention.

A typical plasma etching system that can be used with this process id shown schematically in FIG. 1 and is generally designated as 30. A plasma etching system such as the one shown schematically in FIG. 1, is often referred to commercially as a downstream etch system. Downstream etching system 10 includes a plasma chamber 12 in flow communication by way of conduit 14 with an etching chamber 22. With such a plasma etching system 10, the reactive species are created before being introduced into etching chamber 22 and are then transported downstream to etch chamber 22 to etch the selected metal substrate 26. Plasma chamber 12 has an external energy source 28 to create the chemical species necessary for this configuration. In the present example external energy source 28 is in the form of a radio frequency (rf) power source inductively coupled to a plasma quartz tube. Other appropriate energy sources, for example a pair of oppositely placed electrodes, inductive coils, or microwave energy, can also be used with this configuration to create the reactive species.

Inside etching chamber 22 is pallet 24 which supports a plurality of substrates 26, here a plurality of semiconductor wafers having metal thin films, to be etched. Pallet 24 can be cooled or heated, as desired to be compatible with the rest of the selected parameters. Pallet 24 is typically maintained in a temperature range from 5° to 60° C. Optionally, in order to obtain directional or anistropic etching, a bias may be applied in the known manner to substrate 26 in etching chamber 22.

With this configuration a plasma 30 is created using approximately 3 kW of energy supplied by energy source 28. Power from energy source 28 typically is in the range of 50 watts to 5 kW. The frequency can range between 10 kHz and 200 MHz, with 13.56 MHz being the most common. As an example, with this arrangement, a noble gas plasma 30, here an argon plasma, is created in plasma chamber 12 and then moved downstream through conduit 14 from plasma chamber 12, through a mixing chamber 16, prior to being pumped into reaction or etch chamber 22, by way of dispersion nozzle 20. The argon, or other noble gas plasma, is introduced with gas flow rates in the range of 5 to 1000 standard cubic centimeters per minute (sccm's). In the present example mixing chamber 16 is in the form of a "T"-shaped intersection in conduit 14. The selected organic halide, here ethylene dibromide, is also introduced into mixing chamber 16 at the same time as plasma 30. Analogously, mixing chamber 16 could simply comprise any location where preformed plasma 30 and organohalide 32 exist conjointly in a manner that allows them to react with each other enroute to etch chamber 22. The combination of the pre-formed argon plasma and organic halide in mixing chamber 16, in this downstream fashion, makes possible the formation of the desired reactive precursors, as shown in FIG. 3. The reactive precursors thus formed are then transported via conduit 14 to nozzle 20 and into reaction chamber 22 to etch the metal films on substrate 26 and organometallic byproducts 36 are formed.

In accordance with this example the chemical sources for the organic halides used to provide the reactive species originate most preferably from liquid sources. Any system that employs liquid sources and can appropriately convert them to gas species can be used. Examples of systems that can be used with the described embodiment include a liquid delivery system and preferably, as described in this example, a bubbler system.

With the liquid delivery system, the liquid source is pumped through a liquid flow controller, which transports selected metered amounts of liquid to a vaporizer. The vaporizer vaporizes the exact amount of gas desired and delivers it to the system.

In the present example, the liquid sources are delivered to mixing chamber 16 using a nitrogen bubbler system 18. Bubbling nitrogen, or other suitable gas through the organic halide forms a gas. Other suitable gases for use with the bubbler system include argon, helium or any other inert gas. The flow rate of the gas through bubbler system 18 is typically in the range of 5–1000 sccm's. The temperature range for the operation of bubbler system 18 ranges from approximately 20° to 60° C. The organic halide preferred in this example is ethylene dibromide. The ethylene dibromide gas 32 is combined with the argon plasma 30 in mixing chamber 16. This combining of the reactants in this soft plasma or downstream manner helps to ensure formation of the desired reactant precursor complexes which are necessary to etch the metal substrate and form the desired organometallic byproducts as part of this inventive process. Metal substrate 26 in the example is aluminum, but it is to be understood that this process also works with other metal film substrates, for example copper, aluminum-copper alloys, titanium, and the like. A direct plasma on organic halide 32, here ethylene dibromide, would include chemical reactions that would undesirably reduce these materials to carbon, $H_2$, and the elemental halogen, here $Br_2$, rendering such products incompatible with the formation of required precursors. Hence a downstream or soft plasma approach is used. Soft plasma is another term used to describe the downstream plasma approach, where the plasma is created at a first location and transported downstream to another location. Such a reaction of the argon plasma downstream causes the formation of activated precursor complexes accordingly as shown in FIG. 3, where the reactive forms of the compounds are designated with an asterisk and x is an integer between 1 and 3, representing a stoichiometric coefficient. With this soft plasma approach a reactive form of the halogen is created, here an atomic bromide radical rather than molecular bromide. Additionally, as stated above, the carbon and hydrogen exist as hydrocarbon radicals, organohalide radicals and hydrogen radicals rather than in the undesirable form of elemental carbon and elemental hydrogen. The activated complexes shown by the asterisk in FIG. 3 are transported downstream to etch metal substrate 26 and consequently producing the desired organometallic byproducts 36. FIG. 4 shows the reactions that take place in etch chamber 22, between the activated organohalides 32 and metal substrate 26. The organohalide radicals combine with the metal, releasing organometallic halides and organohalides, again, where x and y are integers between 1 and 3, representing stoichiometric coefficients. The organometallic byproducts 36 thus formed have low vapor pressures and can then be easily removed by pumping them out of etch chamber 22.

Turning first to the noble gas plasma, the preferred noble gas is argon, but any of the noble gases may be used. The methods for forming a noble gas plasma are well known in the art and are briefly described above and will not be described in further detail herein.

Turning now to the organic halide for forming the reactive etching precursors of this process, the preferred starting compound is ethylene dibromide. Reactive precursors can be formed from any organic halide with sufficient vapor pressure. By sufficient vapor pressure it is meant a vapor pressure which allows the formation of activated complexes to etch the metal films and form organometallic compounds as the etch byproducts. The vapor pressure of a liquid depends on the ease with which its molecules can leave the liquid and enter the vapor state. In liquids where the intermolecular attractive forces are strong, the vapor pressure will be low, and in liquids where the attractive forces are weak, the vapor pressure will be high. Examples of organic halides that can be used with this process are ethylene dihalide, vinyl halide, propyl halides, and the like.

Figure 5:
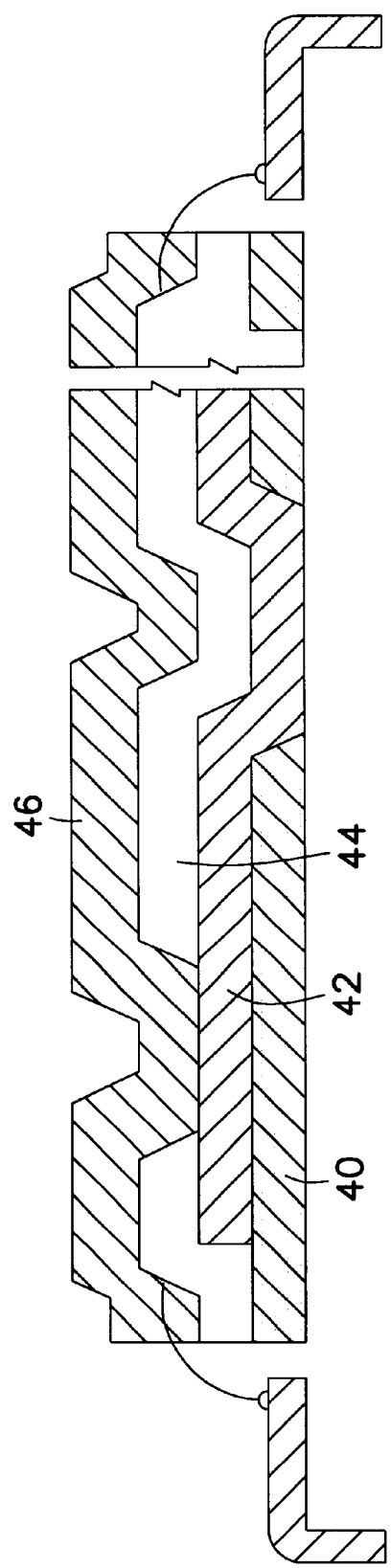
FIG. 5 is a schematic cross-section of a semiconductor die having a metal layer on it such as would be etched in accordance with the process of this invention.

The process of this invention allows an etch reaction that does not produce inorganic etch byproducts. Conventional etching of metals in current fabrication processes use chemistries that produce inorganic etch byproducts. The activation energy associated with such reactions are generally high because the inorganic etch products are generally very stable with high heats of formation and their vapor pressures are low, leading to low etch rates. Generally, high etch rates are desirable as they allow higher production throughputs. This patent describes a process to etch metals such that organometallic compounds are formed as byproducts. The advantages are that, since organometallics generally have high vapor pressures and low heats of formation, etching can be performed at a faster rate. The faster etch rates also favor higher production throughputs that are prerequisite to the economic fabrication of integrated circuits. Accordingly, with the process described herein products can be manufactured more economically by this process. Such products include, for example, integrated circuits, multichip modules, electronic devices, and the like as can be seen in FIG. 5, which includes substrate 40, first metal layer 42, dielectric 44 and a second layer 46.

It will therefore be understood that modifications and variations are possible without departing from the scope of the invention as expressed in the following claims.

I claim:

1. A method for etching, comprising:
   adding an organohalide to a noble gas plasma, wherein the organohalide is selected to have a vapor pressure allowing the formation of activated complexes to etch a metal film of a substrate and form organometallic compounds as etch byproducts; and
   exposing the metal film of the substrate to the activated complexes, causing the substrate to be etched and organometallic compounds to be formed as byproducts from the reaction of the activated complexes and etching of the substrate.

2. The method of claim 1, wherein the metal film is selected from the group consisting of aluminum, copper, aluminum-copper alloys, tin and titanium nitrides.

3. The method of claim 1, wherein the organohalide is selected from the group consisting of ethylene dichloride, vinyl chloride, propyl chloride, ethylene dibromide, vinyl bromide and propyl bromide.

4. The method of claim 1, wherein the noble gas plasma includes an argon plasma.

5. An integrated circuit produced by a process comprising:
   adding an organohalide to a noble gas plasma, wherein the organohalide is selected to have a vapor pressure allowing the formation of activated complexes to etch a metal film of a substrate and form organometallic compounds as etch byproducts; and
   exposing the metal film of the substrate to the activated complexes, causing the substrate to be etched and organometallic compounds to be formed as byproducts from the reaction of the activated complexes and etching of the substrate.

6. The integrated circuit of claim 5, wherein the organohalide is selected from the group consisting of ethylene dichloride, vinyl chloride, propyl chloride, ethylene dibromide, vinyl bromide and propyl bromide.

7. The integrated circuit of claim 5, wherein the noble gas plasma includes an argon plasma.

8. An etching system, comprising:
   a mixing chamber that receives a noble gas plasma and an organohalide, wherein the organohalide is selected to have a vapor pressure allowing the formation of activated complexes to etch the metal films and form organometallic compounds as etch byproducts; and
   an etching chamber coupled to the mixing chamber, the etching chamber having a substrate with a metal film, such that the etching chamber receives the activated complexes, causing the substrate to be etched and organometallic compounds to be formed as byproducts from the reaction of the activated complexes and etching of the substrate.

9. The etching system of claim 8, wherein the organohalide is selected from the group consisting of ethylene dichloride, vinyl chloride, propyl chloride, ethylene dibromide, vinyl bromide and propyl bromide.

10. The etching system of claim 8, wherein the metal film is selected from the group consisting of aluminum, copper, aluminum-copper alloys, tin and titanium nitrides.

11. The etching system of claim 8, wherein the noble gas plasma includes an argon plasma.

12. An etching system, comprising:
   a plasma chamber that forms a noble gas plasma;
   a mixing chamber coupled to the plasma chamber, such that the mixing chamber receives the noble gas plasma and adds an organohalide, wherein the organohalide is selected to have a vapor pressure allowing the formation of activated complexes to etch the metal films and form organometallic compounds as etch byproducts; and
   an etching chamber coupled to the mixing chamber, the etching chamber having a substrate with a metal film, such that the etching chamber receives the activated complexes, causing the substrate to be etched and organometallic compounds to be formed as byproducts from the reaction of the activated complexes and etching of the substrate.

13. The etching system of claim 12, wherein the organohalide is selected from the group consisting of ethylene dichloride, vinyl chloride, propyl chloride, ethylene dibromide, vinyl bromide and propyl bromide.

14. The etching system of claim 12, wherein the metal film is selected from the group consisting of aluminum, copper, aluminum-copper alloys, tin and titanium nitrides.

15. The etching system of claim 12, wherein the noble gas plasma includes an argon plasma.

16. The etching system of claim 12, wherein the plasma chamber introduces the noble gas plasma to the mixing chamber at a gas flow rate in a range of 5 to 1000 standard cubic centimeters per minute (sscm).

17. The etching system of claim 12, wherein the etching chamber includes a pallet, the pallet supporting the substrate.

18. A system for plasma etching, comprising:
   a plasma chamber that forms a noble gas plasma;
   a bubbler system operatively coupled to the plasma chamber, the bubbler system forming an organohalide selected to have a vapor pressure allowing the formation of activated complexes to etch the metal films and form organometallic compounds as etch byproducts;
   a mixing chamber coupled to the plasma chamber and the bubbler system, wherein the mixing chamber receives and mixes the noble gas plasma and the organohalide such that activated complexes are formed; and
   an etching chamber coupled to the mixing chamber, the etching chamber having a substrate with a metal film, such that the etching chamber receives the activated complexes, causing the substrate to be etched and organometallic compounds to be formed as byproducts from the reaction of the activated complexes and etching of the substrate.

19. The system of claim 18, wherein the bubbler system has a temperature in a range of 20°–60° Celsius.

20. The system of claim 18, wherein the organohalide is selected from the group consisting of ethylene dichloride, vinyl chloride, propyl chloride, ethylene dibromide, vinyl bromide and propyl bromide.

21. The system of claim 18, wherein the metal film is selected from the group consisting of aluminum, copper, aluminum-copper alloys, tin and titanium nitrides.

22. A system for plasma etching, comprising:
   a plasma chamber that forms a noble gas plasma;
   a liquid flow controller operatively coupled to the plasma chamber, the liquid flow controller outputting an organohalide in a liquid form;
   a vaporizer coupled to the liquid flow controller, the vaporizer receiving the organohalide in the liquid form and mixing the organohalide in the liquid form with an inert gas to produce an organohalide in a vapor form;
   a mixing chamber coupled to the plasma chamber and the vaporizer, wherein the mixing chamber receives and mixes the noble gas plasma and the organohalide in the vapor form such that activated complexes are formed; and
   an etching chamber coupled to the mixing chamber, the etching chamber having a substrate, such that the etching chamber receives the activated complexes, causing the substrate to be etched and organometallic compounds to be formed as byproducts from the reaction of the activated complexes and etching of the substrate.

23. The system of claim 22, wherein a gas flow rate of the inert gas in the vaporizer is in a range of 5 to 1000 standard cubic centimeters per minute (sscm).

24. The system of claim 22, wherein the inert gas is selected from the group consisting of nitrogen, argon and helium.

25. A system, comprising:
   a plasma chamber that forms a noble gas plasma;
   an external energy source coupled to the plasma chamber, the external energy source supplying power to the plasma chamber;
   a mixing chamber coupled to the plasma chamber, such that the mixing chamber receives the noble gas plasma and adds an organohalide, wherein the organohalide is selected to have a vapor pressure allowing the formation of activated complexes to etch the metal films and form organometallic compounds as etch byproducts; and
   an etching chamber coupled to the mixing chamber, the etching chamber having a substrate with a metal film, such that the etching chamber receives the activated complexes, causing the substrate to be etched and organometallic compounds to be formed as byproducts from the reaction of the activated complexes and etching of the substrate.

26. The system of claim 25, wherein the external energy source supplies power of approximately 3 kilowatts (kW).

27. The system of claim 25, wherein the external energy source supplies power in a range of 50 watts to 5 kW.

28. The system of claim 25, wherein the external energy source includes a radio frequency power source inductively coupled to a plasma quartz tube.

29. The system of claim 28, wherein the radio frequency power source produces a frequency in a range of 10 kilo-Hertz (kHz) to 200 mega-Hertz (MHZ).

30. The system of claim 28, wherein the radio frequency power source produces a frequency of approximately 13.56 MHZ.

31. The system of claim 25, wherein the external energy source includes a pair of electrodes.

32. The system of claim 25, wherein the external energy source includes a number of inductive coils.

33. The system of claim 25, wherein the external energy source includes a microwave energy unit.

* * * * *